US008547704B2

(12) United States Patent
Kuo

(10) Patent No.: US 8,547,704 B2
(45) Date of Patent: Oct. 1, 2013

(54) BUTTON STRUCTURE AND ELECTRONIC DEVICE USING THE SAME

(75) Inventor: Ting-Chang Kuo, Taipei (TW)

(73) Assignee: Inventec Corporation (TW)

( * ) Notice: Subject to any disclaimer, the term of this patent is extended or adjusted under 35 U.S.C. 154(b) by 177 days.

(21) Appl. No.: 13/164,460

(22) Filed: Jun. 20, 2011

(65) Prior Publication Data

US 2012/0250273 A1 Oct. 4, 2012

(30) Foreign Application Priority Data

Mar. 31, 2011 (TW) ............................ 100111356 A

(51) Int. Cl.
*H05K 7/00* (2006.01)
*H05K 5/02* (2006.01)
*H01H 3/12* (2006.01)

(52) U.S. Cl.
USPC ....... 361/752; 361/679.01; 361/748; 200/341

(58) Field of Classification Search
USPC ................ 200/341, 402, 408, 535, 276, 277, 200/502, 520, 534, 317, 314; 361/679.01, 361/752, 748
See application file for complete search history.

(56) References Cited

U.S. PATENT DOCUMENTS 5,803,238 A * 9/1998 Roza .......................... 200/332.1
5,905,238 A * 5/1999 Hung ............................ 200/314
6,433,773 B1 * 8/2002 Hasuda ......................... 345/156
6,828,519 B2 * 12/2004 Bui et al. ...................... 200/341
8,253,046 B2 * 8/2012 Chen et al. .................... 200/5 A
2009/0301852 A1 * 12/2009 Keist et al. .................... 200/341
2011/0036693 A1 * 2/2011 Lin et al. ....................... 200/314
2011/0067989 A1 * 3/2011 Mao et al. ...................... 200/314

FOREIGN PATENT DOCUMENTS

TW I300902 9/2008
TW I311703 7/2009

* cited by examiner

*Primary Examiner* — Angel R Estrada
*Assistant Examiner* — Dimary Lopez
(74) *Attorney, Agent, or Firm* — Lowe Hauptman & Ham, LLP

(57) ABSTRACT

A button structure and an electronic device using the same are provided. The button structure is disposed on a casing and comprises an elastic element and a button. The elastic element comprises a first support portion, a second support portion and a carrying portion. The carrying portion is connected between the first support portion and the second support portion. The first support portion and the second support portion lean on the casing. The button is disposed on the carrying portion.

17 Claims, 3 Drawing Sheets

BUTTON STRUCTURE AND ELECTRONIC DEVICE USING THE SAME

This application claims the benefit of Taiwan application Serial No. 100111356, filed Mar. 31, 2011, the subject matter of which is incorporated herein by reference.

BACKGROUND OF THE INVENTION

1. Field of the Invention

The invention relates in general to a button structure and an electronic device using the same, and more particularly to a button structure with an elastic element and an electronic device using the same.

2. Description of the Related Art

The conventional button structure of an electronic device comprises a button and a metal dome. The button when pressed touches the metal dome.

In generally, the surface of the button touches the protrusion of the metal dome and forms a surface-point touch, which may easily cause the button to tilt to warp or end up with a poor contact between the button and metal dome. Particularly, when the button is strip-shaped, the problems of warpage and poor contact would become even worse.

SUMMARY OF THE INVENTION

The invention is directed to a button structure and an electronic device using the same capable of improving the warpage occurring when the button structure is pressed and the poor contact.

According to a first aspect of the present invention, a button structure is provided. The button structure is disposed on a casing. The button structure comprises an elastic element and a button. The elastic element comprises a first support portion, a second support portion and a carrying portion. The carrying portion is connected between the first support portion and the second support portion. The first support portion and the second support portion lean on the casing. The button is disposed on the carrying portion.

According to a second aspect of the present invention, an electronic device is provided. The electronic device comprises a casing and a button structure. The button structure is disposed on a casing. The button structure comprises an elastic element and a button. The elastic element comprises a first support portion, a second support portion and a carrying portion. The carrying portion is connected between the first support portion and the second support portion. The first support portion and the second support portion lean on the casing. The button is disposed on the carrying portion.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
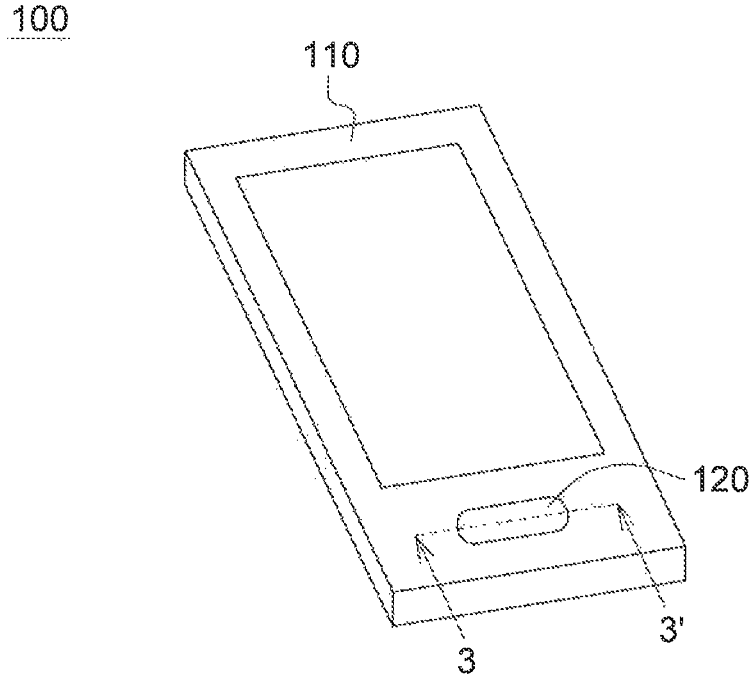
FIG. 1 shows a 3D diagram of an electronic device according to an embodiment of the invention.

Referring to FIG. 1, a 3D diagram of an electronic device according to an embodiment of the invention is shown. The electronic device 100 is realized by such as a mobile phone, a tablet PC or a touch device. The electronic device 100 comprises a casing 110 and a button structure 120 disposed on the casing 110.

Figure 2:
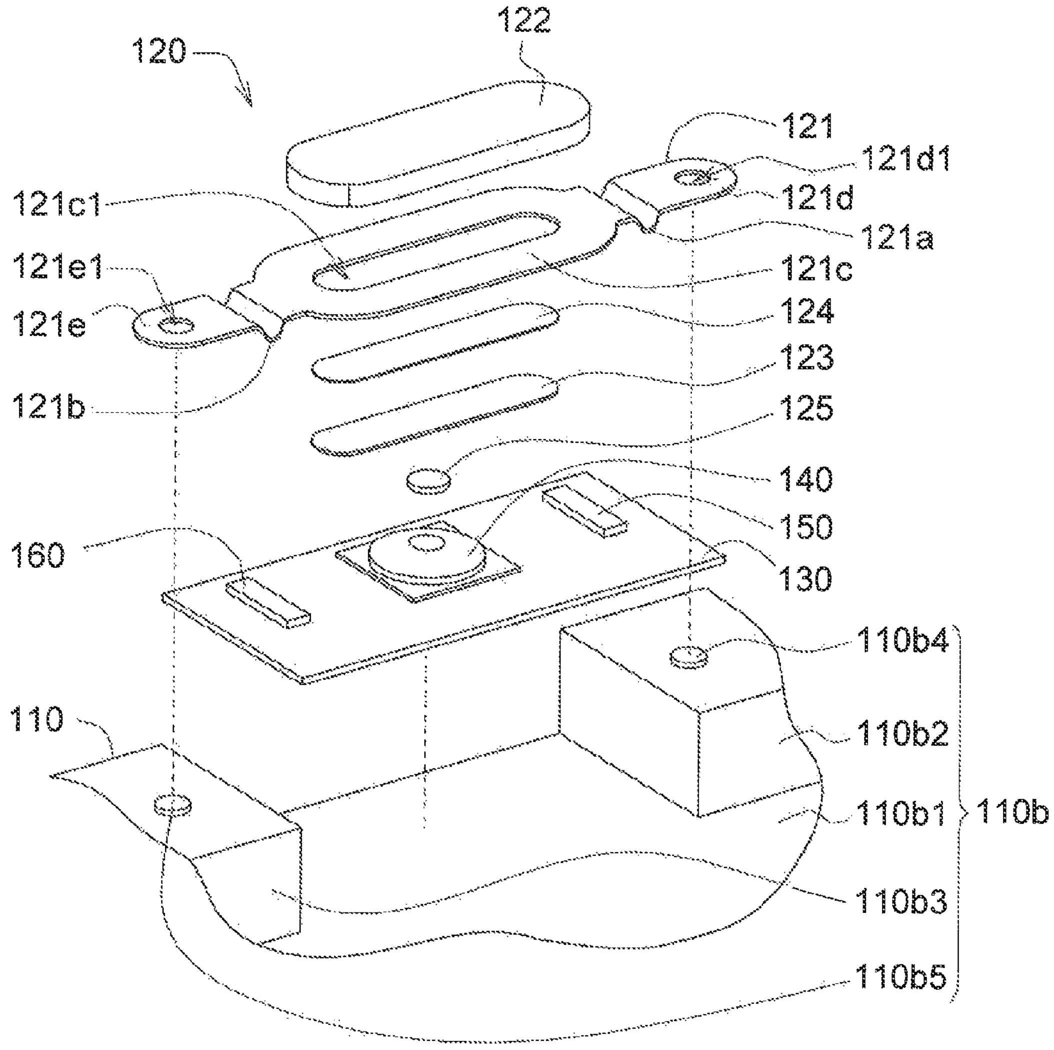
FIG. 2 shows an explosion of the button structure of FIG. 1.

Referring to FIG. 2, an explosion of the button structure of FIG. 1 is shown. The button structure 120 comprises an elastic element 121 and a button 122. The elastic element 121 comprises a first support portion **121*a*, a second support portion 121*b* and a carrying portion 121*c*. The carrying portion 121*c* is connected between the first support portion 121*a* and the second support portion 121*b*. The first support portion 121*a* and the second support portion 121*b* lean on the casing 110. The button 122 is disposed on the carrying portion 121*c*. Since the first support portion 121*a* and the second support portion 121*b* lean on the casing 110, the button 122 is supported by the first support portion 121*a* and the second support portion 121*b*** when pressed and will not generate warpage at one end.

The elastic element 121 is a bending piece. For example, the elastic element 121 is formed by a plate or a sheet metal by the bending process or the stamping process. Since the elastic element 121 can be formed by a thin plate, the thickness of the button structure 120 can thus be reduced, and it is easier to dispose the button structure 120 in a narrow space.

The elastic element 121 further comprises a first extension portion **121*d* and a second extension portion 121*e*. The first support portion 121*a* is connected between the first extension portion 121*d* and the carrying portion 121*c*. The second support portion 121*b* is connected between the second extension portion 121*e* and the carrying portion 121*c*. The first extension portion 121*d* and the second extension portion 121*e* are engaged on the casing 110, and the displacement of the first extension portion 121*d* and the second extension portion 121*e* is restricted by the casing 110**.

As indicated in FIG. 2, the carrying portion **121*c* has a first through hole 121*c*1 covered by the button 122. For example, the area of the button 122 is larger than that of the first through hole 121*c*1 and the button 122 is located at a position corresponding to the first through hole 121*c*1, so that the button 122 can cover the entire first through hole 121*c*1. Moreover, the first through hole 121*c*1 increases the flexibility of the elastic element 121, and makes the elastic element 121, when pressed by the same force, easier to be deformed to touch the switch 140**.

Figure 3:
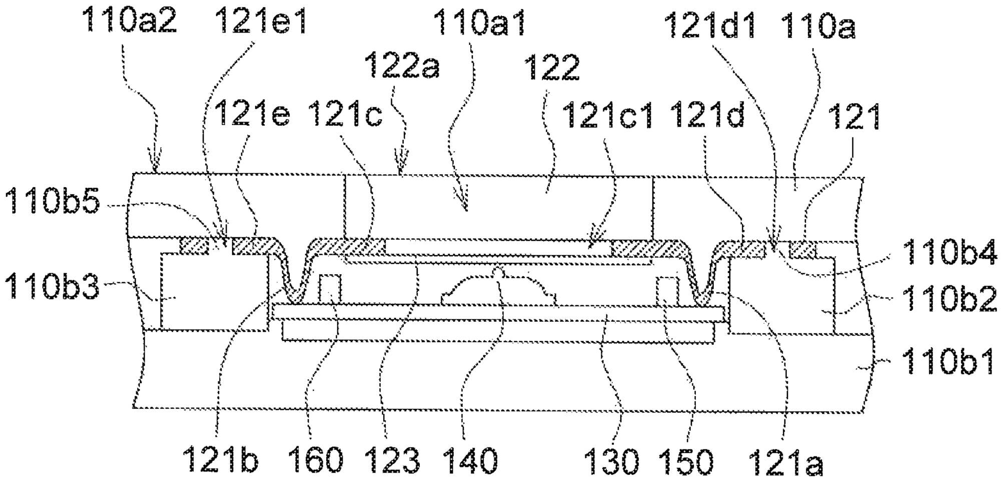
FIG. 3 (the light pervious adhesive film and the light pervious pad are not illustrated) shows a cross-sectional view along the cross-sectional line 3-3' of FIG. 1.

Referring to FIGS. 2 and 3. FIG. 3 (the light pervious adhesive film and the light pervious pad are not illustrated) shows a cross-sectional view along the cross-sectional line 3-3' of FIG. 1. The casing 110 comprises a light pervious upper cover **110*a* and a support structure 110*b*. The light pervious upper cover 110*a* has a second through hole 110*a*1 located at a position corresponding to the button 122, so that the button 122 is received in the second through hole 110*a*1 of the light pervious upper cover 110*a*. Preferably but not restrictively, the shape and size of the second through hole 110*a*1 are similar to that of the button 122, so that the button 122 can fill up the second through hole 110*a*1**.

As indicated in FIG. 2, the support structure **110*b* of the casing 110 comprises an enhancement plate 110*b*1, a first engaging portion 110*b*2 and a second engaging portion 110*b*3. The first engaging portion 110*b*2 is protruded from the enhancement plate 110*b*1 and corresponding to the first extension portion 121*d*. The second engaging portion 110*b*3 is protruded from the enhancement plate 110*b*1 and corresponding to the second extension portion 121*e*. As indicated in FIG. 3, the light pervious upper cover 110*a* and the first engaging portion 110*b*2 clamp the first extension portion 121*d*, and the light pervious upper cover 110*a* and the second engaging portion 1102*b*3 clamp the second extension portion 121*e* so as to fix the elastic element 121**.

As indicated in FIG. 3, the support structure **110*b* of the casing 110 further comprises a first positioning pillar 110*b*4 and a second positioning pillar 110*b*5. The first positioning pillar 110*b*4 is protruded from the first engaging portion 110*b*2 and passes through the first positioning hole 121*d*1 of the first extension portion 121*d*. The second positioning pillar 110*b*5 is protruded from the second engaging portion 110*b*3 and passes through the second positioning hole 121*e*1 of the second extension portion 121*e*. With the positioning pillar and the positioning hole being engaged, the elastic element is more firmly disposed on the casing 110**.

The light pervious upper cover **110*a* of the casing 110 has a first upper surface 110*a*2. The button 122 has a second upper surface 122*a*. The first upper surface 110*a*1 is substantially aligned and coplanar with the second upper surface 122*a*. That is, the button 122 is not protruded from the first upper surface 110*a*2 of the light pervious upper cover 110*a*. In the present embodiment of the invention, the thickness of the light pervious upper cover 110*a* is substantially the same with the thickness of the button 122. However, in other implementations, the thickness of the light pervious upper cover 110*a* can be different from the thickness of the button 122**.

As indicated in FIG. 3, the electronic device 100 further comprises a motherboard 130 and the switch 140. The motherboard 130 is disposed on the enhancement plate **110*b* of the casing 110 and located between the first engaging portion 110*b*2 and the second engaging portion 110*b*3, wherein the first support portion 121*a* and the second support portion 121*b* lean on the motherboard 130. In other embodiments, the first support portion 121*a* and the second support portion 121*b* can directly lean on the casing 110. The switch 140 is disposed on the motherboard 130 and located at a position corresponding to the button 122, so that the vertical distance between the button 122 and the switch 140** is the shortest, and the response time can thus be shortened.

As indicated in FIGS. 2 and 3, the button structure 120 further comprises a light guide plate (light guider) 123, a light pervious adhesive film 124 and a light pervious pad 125. The light guide plate 123 is disposed on the elastic element 121 and the switch 140 for guiding the light projected onto the light guide plate 123 to exit through the upper surface of the light guide plate 123. The light guide plate 123 may be disposed on the elastic element 121 such as being disposed on the outer surface of the elastic element 121 or in the first through hole **121*c*1 of the elastic element 121. The light pervious adhesive film 124 is disposed on the light guide plate 123, wherein the light pervious adhesive film 124 is located between the button 122 and the light guide plate 123). The light pervious pad 125 is located between the switch 140 and the button 122, and can further fill the space of the button 122 and the switch 140 so as to adjust the touching course. For example, the light pervious pad 125 is disposed on the switch 140, wherein the switch 140 is located at a position corresponding to the first through hole 121*c*1. In other embodiments, the light pervious pad 125 is disposed on light pervious adhesive film 124, the light pervious adhesive film 124 is located between the light guide plate 123 and the light pervious pad 125, and the light pervious pad 125 is located at a position corresponding to the switch 122**.

As indicated in FIG. 3, the electronic device 100 further comprises a first light source 150 and a second light source 160, wherein the first light source 150 and the second light source 160 are disposed on the motherboard 130. The first light source 150 is located between the first engaging portion **110*b*2 and the switch 140, and the second light source 160 is located between the second engaging portion 110*b*3 and the switch 140. In greater details, the first light source 150 is located between the first support portion 121*a* and the switch 130, and the second light source 160 is located between the second support portion 121*b* and the switch 130. Moreover, the material of the elastic element 121 comprises a reflective material, so the first support portion 121*a* and the second support portion 121*b* of the elastic element 121 can reflect the light so as to reduce light leakage. Here, the reflective material is such as metal. Besides, the material of the button 122 comprises a light pervious material, so that the light of the first light source 150 and the second light source 160 can pass through the button 122** and exit. Here, the light pervious material is such as light pervious glass or light pervious plastics.

The button structure and the electronic device using the same disclosed in the above embodiments of the invention have many features exemplified below:

(1). The first support portion and the second support portion lean on the casing, so that the button is supported by the first support portion and the second support portion when pressed and will not generate warpage at one end.

(2). The first through hole increase the flexibility of the elastic element, and makes the elastic element, when pressed by the same force, easier to be deformed to touch the switch.

(3). The light pervious upper cover has a first upper surface, and the button has a second upper surface, wherein the first upper surface is substantially aligned and coplanar with the second upper surface.

(4). The light pervious upper cover presses the elastic element to fix the elastic element.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A button structure disposed on a casing, wherein the button structure comprises:

an elastic element, comprising:

a first support portion;

a second support portion; and a carrying portion connected between the first support portion and the second support portion, wherein the first support portion and the second support portion lean on the casing;

a button disposed on the carrying portion;

wherein the carrying portion has a first through hole covered by the button, and the button structure further comprises:

a light guide plate disposed on the elastic element;

a light pervious adhesive film disposed on the light guide plate, wherein the light pervious adhesive film is located between the button and the light guide plate; and a light pervious pad disposed on the light pervious adhesive film, wherein the light pervious adhesive film is located between the light guide plate and the light pervious pad.

2. The button structure according to claim 1, wherein the elastic element further comprises:

a first extension portion, wherein the first support portion is connected between the first extension portion and the carrying portion; and a second extension portion, wherein the second support portion is connected between the second extension portion and the carrying portion;

wherein the first extension portion and the second extension portion are engaged on the casing.

3. The button structure according to claim 2, wherein the carrying portion has a first through hole covered by the button.

4. The button structure according to claim 1, wherein the material of the button comprises a light pervious material, and the material of the elastic element comprises a reflective material.

5. The button structure according to claim 4, wherein the button is formed by light pervious glass or light pervious plastics, and the elastic element is formed by metal.

6. An electronic device, comprising:

a casing; and a button structure disposed on the casing, wherein the button structure comprises:

an elastic element, comprising:

a first support portion;

a second support portion;

a carrying portion connected between the first support portion and the second support portion, wherein the first support portion and the second support portion lean on the casing;

a button disposed on the carrying portion;

wherein the carrying portion has a first through hole covered by the button, and the button structure further comprises:

a light guide plate disposed on the elastic element;

a light pervious adhesive film disposed on the light guide plate, wherein the light pervious adhesive film is located between the button and the light guide plate; and a light pervious pad disposed on the light pervious adhesive film, wherein the light pervious adhesive film is located between the light guide plate and the light pervious pad, and the light pervious pad is located at a position opposite to a switch.

7. The electronic device according to claim 6, wherein the electronic device further comprises:

a first extension portion, wherein the first support portion is connected between the first extension portion and the carrying portion; and a second extension portion, wherein the second support portion is connected between the second extension portion and the carrying portion;

wherein the first extension portion and the second extension portion are engaged on the casing.

8. The electronic device according to claim 7, wherein the casing comprises:

a light pervious upper cover having a second through hole, wherein the second through hole is opposite to the button, so that the button is received in the second through hole; and a support structure, comprising:

an enhancement plate;

a first engaging portion protruded from the enhancement plate and corresponding to the first extension portion;

a second engaging portion protruded from the enhancement plate and corresponding to the second extension portion;

wherein the light pervious upper cover and the first engaging portion clamp the first extension portion, and the light pervious upper cover and the second engaging portion clamp the second extension portion.

9. The electronic device according to claim 8, wherein the support structure further comprises:

a first positioning pillar protruded from the first engaging portion wherein the first positioning pillar passes through a first positioning hole of the first extension portion; and a second positioning pillar protruded from the second engaging portion wherein the second positioning pillar passes through a second positioning hole of the second extension portion.

10. The electronic device according to claim 8, further comprising:

a motherboard disposed on the enhancement plate and located between the first engaging portion and the second engaging portion, wherein the first support portion and the second support portion lean on the motherboard; and the switch disposed on the motherboard, wherein the position of the switch corresponds to the button.

11. The electronic device according to claim 10, further comprising a first light source and a second light source, wherein the first light source and the second light source are disposed on the motherboard, the first light source is located between the first engaging portion and the switch, and the second light source is located between the second engaging portion and the switch.

12. The electronic device according to claim 11, wherein the first light source is located between the first support portion and the switch, and the second light source is located between the second support portion and the switch.

13. The electronic device according to claim 10, wherein the carrying portion has the first through hole covered by the button covers the first through hole, and the button structure further comprises:

a light guide plate disposed on the elastic element;

a light pervious adhesive film disposed on the light guide plate, wherein the light guide plate is located between the button and the light pervious adhesive film; and a light pervious pad disposed on the switch, wherein the switch is located at a position opposite to the first through hole.

14. The electronic device according to claim 13, further comprising a first light source and a second light source, wherein the first light source and the second light source are disposed on the motherboard, the first light source is located between the first engaging portion and the switch, and the second light source is located between the second engaging portion and the switch.

15. The electronic device according to claim 14, wherein the first light source is located between the first support portion and the switch, and the second light source is located between the second support portion and the switch.

16. The electronic device according to claim 6, wherein the material of the button comprises a light pervious material, and the material of the elastic element comprises a reflective material.

17. The electronic device according to claim 16, wherein the button is formed by light pervious glass or light pervious plastics, and the elastic element is formed by metal.

* * * * *